(12) United States Patent
Rasch

(10) Patent No.: US 12,169,534 B2
(45) Date of Patent: Dec. 17, 2024

(54) WORST CASE NOISE AND BOUND MANAGEMENT FOR RPU CROSSBAR ARRAYS

(71) Applicant: International Business Machines Corporation, Armonk, NY (US)

(72) Inventor: Malte Johannes Rasch, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1010 days.

(21) Appl. No.: 17/113,898

(22) Filed: Dec. 7, 2020

(65) Prior Publication Data
US 2022/0180164 A1  Jun. 9, 2022

(51) Int. Cl.
| | | |
|---|---|---|
| G06F 17/16 | (2006.01) | |
| G06F 5/01 | (2006.01) | |
| G06N 3/065 | (2023.01) | |
| G06N 3/08 | (2023.01) | |

(52) U.S. Cl.
CPC ............... *G06F 17/16* (2013.01); *G06F 5/01* (2013.01); *G06N 3/065* (2023.01); *G06N 3/08* (2013.01)

(58) Field of Classification Search
CPC .......... G06F 17/16; G06F 5/01; G06F 7/5443; G06G 7/16; G06N 3/065; G06N 3/08; G06N 3/084; G11C 11/54
See application file for complete search history.

(56) References Cited

U.S. PATENT DOCUMENTS

| | | |
|---|---|---|
| 6,385,079 B1 | 5/2002 | Tran |
| 9,646,243 B1 | 5/2017 | Gokmen |
| 10,373,051 B2 | 8/2019 | Gokmen et al. |
| 10,984,860 B2 | 4/2021 | Sharma et al. |
| 2018/0253642 A1 | 9/2018 | Gokmen et al. |
| 2018/0293208 A1 | 10/2018 | Gokmen et al. |

(Continued)

FOREIGN PATENT DOCUMENTS

CN   111755062 A   10/2020

OTHER PUBLICATIONS

Mittal S. A Survey of ReRAM-Based Architectures for Processing-In-Memory and Neural Networks. Machine Learning and Knowledge Extraction. 2019; 1(1):75-114. https://doi.org/10.3390/make1010005 (Year: 2018).*

(Continued)

*Primary Examiner* — Andrew Caldwell
*Assistant Examiner* — Carlo Waje
(74) *Attorney, Agent, or Firm* — Steven M. Bouknight

(57) ABSTRACT

Techniques for noise and bound management for DNN training on RPU crossbar arrays using a scaling factor based on a worst-case scenario are provided. In one aspect, a method for noise and bound management includes: obtaining input vector values x for an analog crossbar array of RPU devices, wherein a weight matrix is mapped to the analog crossbar array of RPU devices; and scaling the input vector values x based on a worst-case scenario to provide scaled input vector values x' to use as input to the analog crossbar array of RPU devices, wherein the worst-case scenario includes an assumed maximal weight of the weight matrix multiplied by a sum of absolute values from the input vector values x.

19 Claims, 8 Drawing Sheets

(56) References Cited

U.S. PATENT DOCUMENTS

| | | |
|---|---|---|
| 2018/0293209 A1 | 10/2018 | Gokmen et al. |
| 2019/0057305 A1 | 2/2019 | Denolf et al. |
| 2019/0138882 A1 | 5/2019 | Choi et al. |
| 2019/0294416 A1* | 9/2019 | Hu .......................... G11C 7/16 |
| 2019/0340500 A1 | 11/2019 | Olmschenk |
| 2020/0312406 A1 | 10/2020 | Sharma et al. |
| 2020/0380348 A1 | 12/2020 | Rasch et al. |
| 2020/0380349 A1 | 12/2020 | Rasch et al. |

OTHER PUBLICATIONS

Gokmen et al., "Acceleration of Deep Neural Network Training with Resistive Cross-Point Devices: Design Considerations," Frontiers in Neuroscience, vol. 10, Article 333, Jul. 2016 (13 pages).

Lubna Badri, "Development of Neural Networks for Noise Reduction," The International Arab Journal of Information Technology, vol. 7, No. 3, Jul. 2010, pp. 289-294.

Ivelina Balabanova et al., "Artificial Neural Network for Identification of Signals with Superposed Noises," In International Conference on Intelligent Information Technologies for Industry, Springer, Cham, 2017, pp. 488-495.

Alex Krizhevsky et al., "ImageNet Classification with Deep Convolutional Neural Networks," Advances in Neural Information Processing Systems, 2012, (9 pages).

Mell et al., "The NIST Definition of Cloud Computing," NIST Special Publication 800-145, Sep. 2011 (7 pages).

International Search Report and Written Opinion for PCT/CN2021/128643 dated Jan. 27, 2022 (9 pages).

\* cited by examiner

WORST CASE NOISE AND BOUND MANAGEMENT FOR RPU CROSSBAR ARRAYS

FIELD OF THE INVENTION

The present invention relates to training of deep neural networks (DNNs) having analog crossbar arrays of resistive processing unit (RPU) devices, and more particularly, to techniques for noise and bound management for DNN training on RPU crossbar arrays using a scaling factor based on a worst-case scenario that provides effective run time improvements.

BACKGROUND OF THE INVENTION

A deep neural network (DNN) can be embodied in an analog crossbar array of memory devices such as resistive processing units (RPUs). DNN-based models have been used for a variety of different cognitive-based tasks such as object and speech recognition, and natural language processing. When performing these tasks, neural network training is needed to provide a high level of accuracy. However, the operations performed on an RPU array are analog in nature and thus prone to various sources of noise. When the input values to the RPU array are small (such as for a backward cycle pass), the output signal can be buried by the noise, thus producing an incorrect result.

Further, a digital-to-analog converter (DAC) and an analog-to-digital converter (ADC) are used to convert digital input to the RPU array to an analog signal, and the output from the RPU array back to a digital signal, respectively. Thus, the training process is also limited by the bounded ranges of the DAC and ADC converters employed for the array.

Bound management becomes important for DNN training on RPU arrays, in particular when setting the weights according to auto weight scaling. With auto weight scaling, the available resistive state resources of the RPU devices in the array are optimally mapped in a weight range (resistance values) that is useful for the DNN training by scaling the bounded weight range of the RPU devices with the size of the array.

A conventional approach is to identify a maximum value (m) in an input vector, and scale the input values to the RPU array by that maximum value (m) to obtain the best analog noise performance (noise management). Saturation at the output of the RPU array is eliminated by reducing the values from which the input signal to the RPU array is formed in order to manage the bound (bound management).

However, when the bound is exceeded, repetitive computations are needed with down-scaled inputs to reach an output threshold. While very effective in solving the problem of increased test errors with auto weight scaling, this iterative down-scaling approach undesirably comes at a cost, namely variable run time.

Therefore, effective noise and bound management techniques with improved run time would be desirable.

SUMMARY OF THE INVENTION

The present invention provides techniques for noise and bound management for deep neural network (DNN) training on resistive processing unit (RPU) crossbar arrays using a scaling factor based on a worst-case scenario that provides effective run time improvements. In one aspect of the invention, a method for noise and bound management is provided. The method includes: obtaining input vector values x for an analog crossbar array of RPU devices, wherein a weight matrix is mapped to the analog crossbar array of RPU devices; and scaling the input vector values x based on a worst-case scenario to provide scaled input vector values x' to use as input to the analog crossbar array of RPU devices, wherein the worst-case scenario includes an assumed maximal weight of the weight matrix multiplied by a sum of absolute values from the input vector values x.

For instance, an absolute maximal input value $x_{mx}$ can be computed from the input vector values x, a suggested scaling factor $\sigma$ can be computed as $$\frac{\omega s}{b},$$

wherein $\omega$ is the assumed maximal weight of the weight matrix, s is a total input variable, and b is an output bound of the analog crossbar array of RPU devices, a noise and bound management scaling factor $\alpha$ can be set to the absolute maximal input value $x_{mx}$ or the suggested scaling factor $\sigma$, whichever is larger, and the input vector values x can be scaled using the noise and bound management scaling factor $\alpha$.

A more complete understanding of the present invention, as well as further features and advantages of the present invention, will be obtained by reference to the following detailed description and drawings.

DETAILED DESCRIPTION OF PREFERRED EMBODIMENTS

As provided above, existing noise and bound management techniques involve use of a maximum value (m) in an input vector to scale input values to an RPU array in order to obtain the best analog noise performance (noise management). In order to manage the bound, saturation at the output of the RPU array is eliminated by iteratively reducing the values from which the input signal to the RPU array is formed until an output threshold is reached (bound management). Doing so, however, undesirably leads to run time delays.

Advantageously, provided herein are noise and bound management techniques for deep neural network (DNN) training on analog RPU crossbar arrays when the dynamical range of the (noisy) analog system is limited and run time has to be minimized. Namely, as will be described in detail below, the present approach is to scale the input signal to the RPU array with respect to a worst-case scenario (i.e., a largest possible output for any weight matrix given a particular input) which is used to estimate a scaling factor that is needed to bring the input signal into the limited dynamic range of the analog crossbar system.

Figure 1:
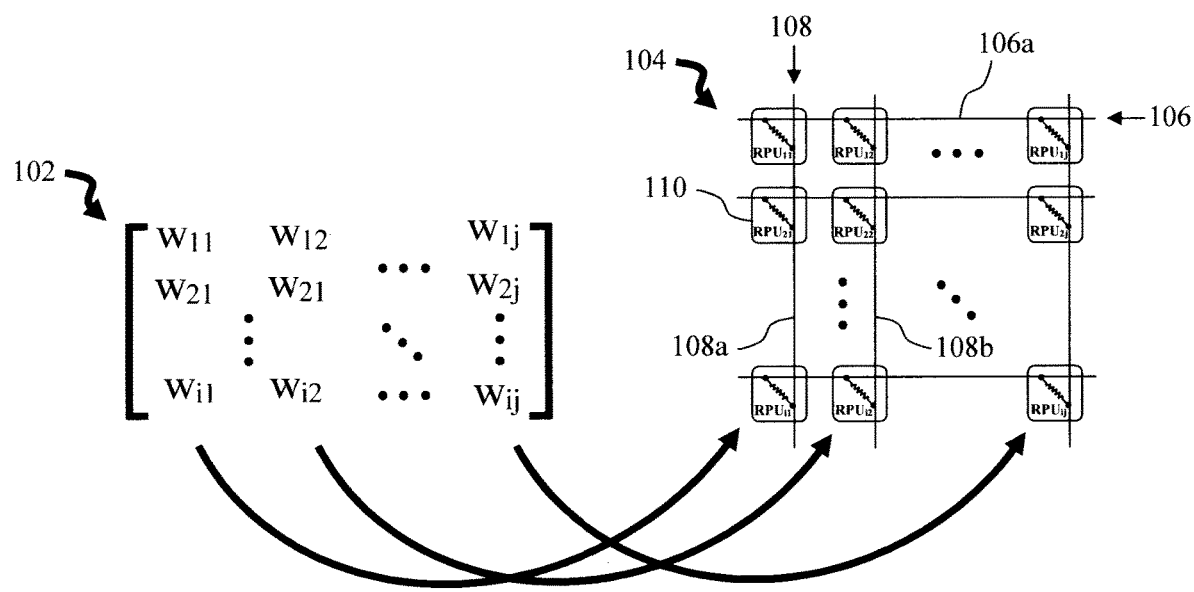
FIG. 1 is a diagram illustrating a deep neural network (DNN) embodied in an analog crossbar array of resistive processing unit (RPU) devices according to an embodiment of the present invention.

As shown in FIG. 1, a DNN can be embodied in an analog crossbar array of RPU devices, where each parameter (weight $W_{ij}$) of an algorithmic (abstract) weight matrix 102 is mapped to a single RPU device ($RPU_{ij}$) on hardware, namely a physical crossbar array 104 of RPU devices 110. The crossbar array 104 has a (first) set of conductive row wires 106 and a (second) set of conductive column wires 108 oriented orthogonal to, and intersecting, the set of conductive row wires 106. See FIG. 1. The intersections of the sets of conductive row wires 106 and column wires 108 are separated by the RPU devices 110 forming the crossbar array 104 of the RPU devices 110. Each RPU device 110 can include an active region between two electrodes (i.e., a two-terminal device). A conduction state of the active region identifies a weight value of the RPU device 110, which can be updated/adjusted by the application of a programming signal to the electrodes.

Each RPU device 110 ($RPU_{ij}$) is uniquely identified based on its location, i.e., in the $i^{th}$ row and $j^{th}$ column of the crossbar array 104. For instance, going from the top to bottom, and from the left to right of crossbar array 104, the RPU device 110 at the intersection of a first conductive row wire 106a and a first conductive column wire 108a is designated as $RPU_{11}$, the RPU device 110 at the intersection of the first conductive row wire 106a and a second conductive column wire 108b is designated as $RPU_{12}$, and so on. The mapping of the weight parameters in weight matrix 102 to the RPU devices 110 in crossbar array 104 follows the same convention. For instance, weight $W_{i1}$ of weight matrix 102 is mapped to $RPU_{i1}$ of the crossbar array 104, weight $W_{i2}$ of weight matrix 102 is mapped to $RPU_{i2}$ of the crossbar array 104, and so on.

The RPU devices 110 of the crossbar array 104 function as the weighted connections between neurons in the DNN. The resistance of the RPU devices 110 can be altered by controlling the voltages applied between individual wires from the sets of conductive row wires 106 and conductive column wires 108. Altering the resistance of the RPU devices 110 is how data is stored in the crossbar array 104 based, for example, on a high resistance state or a low resistance state of the RPU devices 110. The resistance state (high or low) of the RPU devices 110 is read by applying a (read) voltage to the corresponding wires from the sets of conductive row wires 106 and conductive column wires 108, and measuring the current that passes through the target RPU device 110. All of the operations involving weights are performed fully in parallel by the RPU devices 110.

In machine learning and cognitive science, DNN-based models are a family of statistical learning models inspired by the biological neural networks of animals, and in particular the brain. These models may be used to estimate or approximate systems and cognitive functions that depend on a large number of inputs and weights of the connections which are generally unknown. DNNs are often embodied as so-called "neuromorphic" systems of interconnected processor elements that act as simulated "neurons" that exchange "messages" between each other in the form of electronic signals. The connections in DNNs that carry electronic messages between simulated neurons are provided with numeric weights that correspond to the strength or weakness of a given connection. These numeric weights can be adjusted and tuned based on experience, making DNNs adaptive to inputs and capable of learning. For example, a DNN for image classification is defined by a set of input neurons which may be activated by the pixels of an input image. After being weighted and transformed by a function determined by the network's designer, the activations of these input neurons are then passed to other downstream neurons. This process is repeated until an output neuron is activated. The activated output neuron determines a classification of the image.

DNN training can be performed using a process such as stochastic gradient descent (SGD), in which the error gradient of each parameter (weight $W_{ij}$) is calculated using backpropagation. Backpropagation is performed in three cycles, a forward cycle, a backward cycle, and a weight update cycle which are repeated multiple times until a convergence criterion is met.

DNN-based models are composed of multiple processing layers that learn representations of data with multiple levels of abstraction. For a single processing layer where N input neurons are connected to M output neurons, the forward cycle involves computing a vector-matrix multiplication (y=Wx) where the vector x of length N represents the activities of the input neurons, and the matrix W of size M×N stores the weight values between each pair of the input and output neurons. The resulting vector y of length M is further processed by performing a non-linear activation on each of the resistive memory elements and then passed to the next layer.

Once the information reaches to the final output layer, the backward cycle involves calculating the error signal and backpropagating the error signal through the DNN. The backward cycle on a single layer also involves a vector-matrix multiplication on the transpose (interchanging each row and corresponding column) of the weight matrix ($z=W^T\delta$), where the vector $\delta$ of length M represents the error calculated by the output neurons and the vector z of length N is further processed using the derivative of neuron non-linearity and then passed down to the previous layers.

Lastly, in the weight update cycle, the weight matrix W is updated by performing an outer product of the two vectors that are used in the forward and the backward cycles. This outer product of the two vectors is often expressed as $W \leftarrow W+\eta(\delta x^T)$, where $\eta$ is a global learning rate. All of these operations performed on the weight matrix 102 during backpropagation can be implemented with the crossbar array 104 of RPU devices 110.

As highlighted above, a digital-to-analog converter (DAC) and an analog-to-digital converter (ADC) are used to convert the digital input to the RPU devices 110 of the crossbar array 104 to an analog signal, and the output from the RPU devices 110 of the crossbar array 104 back to a digital signal, respectively. With noise and bound management for DNN training on analog RPU crossbar arrays, $$\hat{x} = f_{DAC}\left(\frac{1}{\alpha}x\right) \quad (1)$$

is the input vector in analog space, and $$y = \alpha f_{ADC}(\hat{y}) \quad (2)$$

is the digital output vector, wherein $f_{DAC}$ and $f_{ADC}$ denote the transformation by the DAC and the ADC, respectively, and $\alpha$ is a noise and bound management scaling factor. The operations through the RPU devices 110 of the crossbar array 104 have bounded output values coming from the saturation of the ADC. Namely, the ADC is bounded in some range, $-b, \ldots, b$, wherein values below output bound $-b$ or above output bound $b$ are saturated to the respective bound. The relative information beyond the bound values are lost due to clipping. Conventionally, if the analog computing output $\hat{y}$ is larger than the bound, i.e., $|\hat{y}|>b$ then the computation is repeated with setting $\alpha \leftarrow 2\alpha$ iteratively until the output is below the bound (bound management). However, iterative computation negatively impacts run time.

By contrast, in accordance with the present techniques, input to the RPU devices 110 of the crossbar array 104 is scaled based on a worst-case scenario in order to mitigate the risk of clipped output values due to the limited dynamic range of the analog crossbar array 104 of RPU devices 110. The term 'worst-case scenario' as used herein refers to a largest possible output (i.e., maximal weight) from a weight matrix (such as weight matrix 102) given a particular input vector. The physical conductance representing the weight in an RPU device is limited physically. Thus, it is assumed herein that the weights in the weight matrix are in the range—wmax . . . wmax, where wmax corresponds to gmax (i.e., the maximal attainable conductance of an RPU device). As will be described in detail below, with the present techniques the absolute sum of input signals and an assumption of constant maximal weights are used to compute a noise and bound management scaling factor alpha ($\alpha$) of input and output in the digital periphery (before the DAC or after the ADC) to bring the input into the dynamic range of the RPU devices 110 of the crossbar array 104. Advantageously, the present worst-case management process does not add variable run time, since the result does not need to be recomputed when the bound is clipped, because it is ensured, by taking the worst-case situation as a reference for determining the scaling factor, that the output bound is never clipped.

Figure 2:
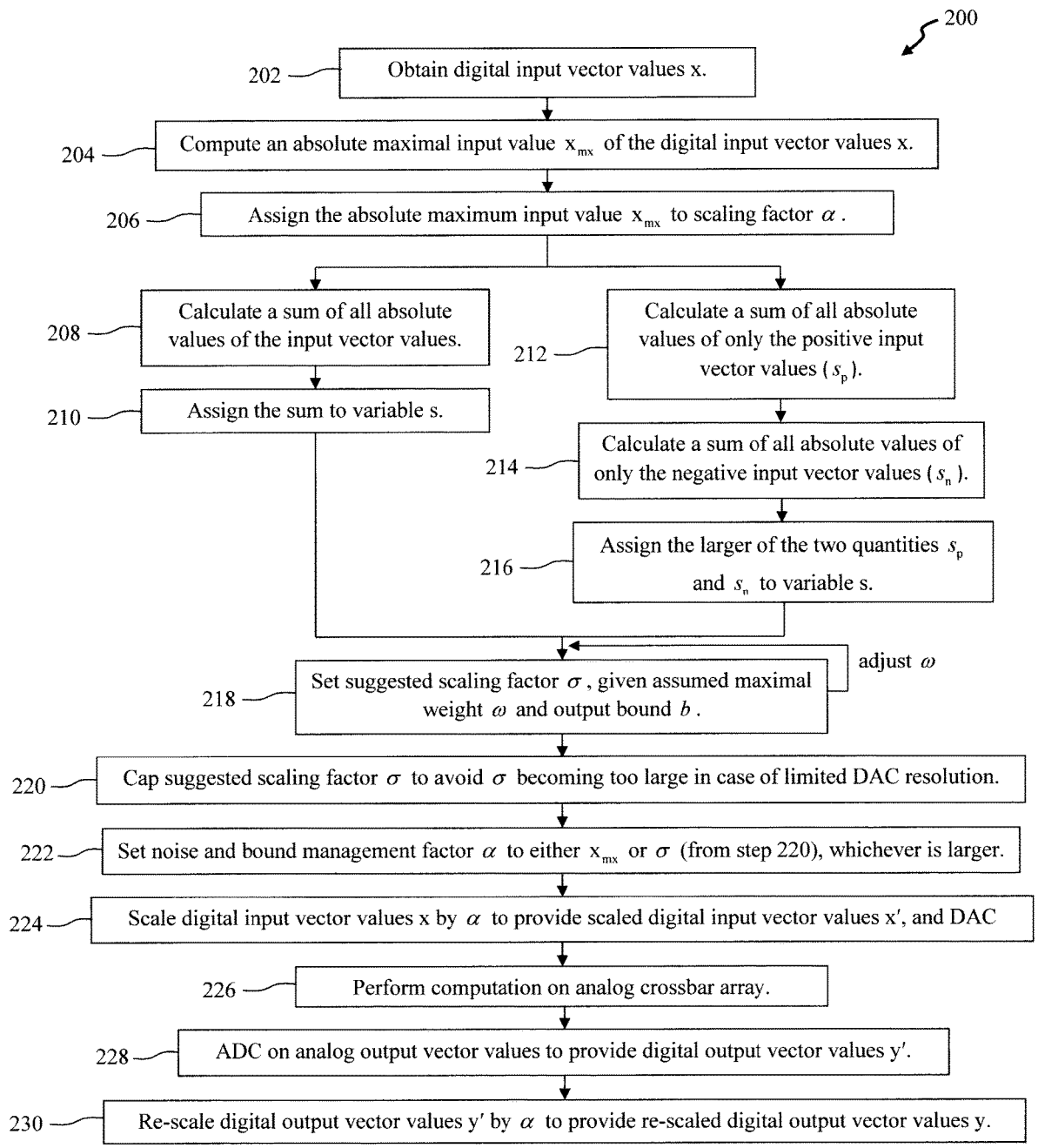
FIG. 2 is a diagram illustrating an exemplary methodology for noise and bound management according to an embodiment of the present invention.

FIG. 2 is a diagram illustrating an exemplary methodology 200 for noise and bound management that scales the input to the RPU devices 110 of the crossbar array 104 with respect to a worst-case scenario. As described above, the forward and backward cycle performed on the weight matrix 102 each involve a vector-matrix multiplication operation. In the analog crossbar array 104 of RPU devices 110, this vector-matrix multiplication operation involves multiplying each input vector value (see below) with a corresponding weight value $W_{ij}$ (on the corresponding row) in the weight matrix 102 and summing the results. This process is also referred to herein as a 'multiply-and-accumulate' operation of the analog crossbar array 104 of RPU devices 110. For each multiply-and-accumulate cycle, the steps of methodology 200 are performed as a pre-computation in digital to determine the scaling factor $\sigma$ used for operations on the analog crossbar array 104 of RPU devices 110. It is notable that, according to an exemplary embodiment, one or more steps of methodology 200 including calculation of the noise and bound management scaling factor $\alpha$, scaling/rescaling the input/output values from the crossbar array 104 of RPU devices 110 by a (see below), etc. are performed outside of the of the RPU array hardware, for example, by an apparatus such as apparatus 600 described in conjunction with the description of FIG. 6, below. Additionally, one or more elements of the present techniques can optionally be provided as a service in a cloud environment. For instance, by way of example only, the training data used for the input vector values (see below) can reside remotely on a cloud server. Also, any of the steps of methodology 200 can be performed on a dedicated cloud server to take advantage of high-powered CPUs and GPUs, after which the result is sent back to the local device.

In step 202, an input vector is obtained. The input vector includes digital values x. The digital values x in the input vector are also referred to herein as 'input vector values x.' According to an exemplary embodiment, the input vector values x include data from a training dataset. By way of example only, the training dataset can be obtained from a database or other repository of DNN training data.

In step 204, an absolute maximal value $x_{mx}$ of the input vector values is computed as:

$$x_{mx} = \max_i |x_i| \quad (3)$$

Thus, $x_{mx}$ may also be referred to herein as the absolute maximal input value. In step 206, the absolute maximal input value $x_{mx}$ is then assigned to the scaling factor $\alpha$.

At this stage in the process, the weight values that will be employed for the vector-matrix multiplication operation performed on the analog crossbar array 104 of RPU devices 110 (see above) are unknown a priori. However, as highlighted above, the worst-case assumption is that all analog weights are maximally positive for all of the positive input vector values and maximally negative for all of the negative input vector values. In that case, in step 208 a sum of all absolute values of the input vector values x is calculated. In step 210, the sum is assigned to a total input variable s, i.e., $s = \Sigma |x_i|$.

In the previous example, the input vector values x (both negative and positive) are given as input to the analog crossbar array 104 of RPU devices 110 in one pass. Alternatively, in another exemplary embodiment the negative input values and the positive input values of the input vector values x are given as input to the analog crossbar array 104 of RPU devices 110 in two separate passes, where the respective other input values of the input vector (negative or positive) are set to zero and the outputs of the two passes is sign-corrected and added accordingly to get the final result. For instance, if the negative input values are given as input to the analog crossbar array 104 of RPU devices 110 in the first pass (while the positive input values are set to zero), then in the second pass the positive input values are given as input to the analog crossbar array 104 of RPU devices 110 (while the negative input values are set to zero), or vice versa. In that case, the corresponding worst-case situation can be applied where it is assumed that all positive (or negative) input vector values hit a maximal positive (or negative) weight, and that all other weights do not contribute to the output (and thus can be assumed to be zero) as the corresponding input values will be set to zero for the respective passes. In that case, the larger quantity for either the positive or negative input vector values is assigned to the total input variable s.

Namely, according to this alternative embodiment, in step 212 a sum of all absolute values of only the positive input vector values ($s_p$) is calculated as:

$$s_p = \Sigma_i I(x_i > 0) \cdot |x_i|, \quad (4)$$

where $I(\text{true})=1$ and $I(\text{false})=0$ indicates whether the condition is true. In step 214, a sum of all absolute values of only the negative input vector values ($s_n$) is calculated as:

$$s_n = \Sigma_i I(x_i < 0) \cdot |x_i|, \quad (5)$$

where I(true)=1 and I(false)=0 indicates whether the condition is true.

In step 216, the larger of the two quantities $s_p$ and $s_n$ is assigned to the total input variable s. Namely, in this exemplary embodiment, the total input variable s is set as follows:

$$s = \max(s_n, s_p). \tag{6}$$

It is assumed that omega (ω) is the maximal weight of the weight matrix 102, i.e., ω is the assumed maximal weight. However, as will be described in detail below, ω can be reduced (for example to 50% of the assumed maximal weight) since occurrence of the worst-case scenario is highly unlikely. Namely, the output could indeed be clipped by the output bound for some unlikely input vectors, but for the majority of cases it will not, so that the DNN training or inference results will not significantly change.

Given that omega (ω) is the assumed maximal weight, the expected worst-case total output is then omega times the total input s, i.e., ωs. As highlighted above, it is desired to have this expected worst-case total output be less than the output bound b. Thus, in step 218, a suggested scaling factor sigma (σ) for the input vector values (in the worst-case scenario) is computed as the product of omega (ω) times the total input s divided by the output bound b, i.e., $$\sigma \leftarrow \frac{\omega s}{b}. \tag{7}$$

As provided above, ω is the assumed maximal weight. According to an exemplary embodiment, ω is a user-defined value based on a mapping of what the maximal conductance value of the RPU devices 110 corresponds to in terms of the "mathematical" weight value of the DNN. For instance, by way of example only, a suitable value for the assumed maximal weight ω might be 0.6. Therefore, based on Equation 7, if an actual total output from the analog crossbar array 104 of RPU devices 110 is indeed as large as the expected worst-case total output (ωs), then sigma (σ)=1 and the total input s does not need to be scaled. As such, the scaling ensures that the output bound b is never hit, even in the worst-case scenario.

However, since occurrence of the worst-case scenario is very unlikely (i.e., it is not likely that the actual total output from the analog crossbar array 104 of RPU devices 110 will be as large as the expected worst-case total output), it may be desirable to adjust the suggested scaling factor sigma (σ) by reducing the assumed maximal weight ω, e.g., to 50% of the assumed maximal weight, and then recomputing the suggested scaling factor in step 218. See FIG. 2 (i.e., adjust ω). In that case, while the expected worst-case total output bound is actually hit, the majority of cases will have outputs that are below the output bound b. Adjusting a in this manner generally produces a larger signal-to-noise ratio (SNR) which is desirable.

As highlighted above, a digital-to-analog converter (DAC) will be used to convert the scaled digital input vector values (as per methodology 200) to an analog signal for use in performing the vector-matrix multiplication operations on analog crossbar array 104 of RPU devices 110. Specifically, the DAC will convert the scaled digital input vector values to analog pulse widths. However, there might be limited DAC resolution. Namely, it is notable that the suggested scaling factor σ, calculated as per Equation 7 above, might actually be so large that any value of the input vector values divided by the suggested scaling factor σ would turn out to be smaller than the smallest bin of the digital-to-analog conversion. In that case, the input to the analog crossbar array 104 of RPU devices 110 would be all zero after DAC conversion.

To avoid this occurrence, it may be desirable in step 220 to cap the suggested scaling factor σ by taking either the value computed from Equation 7 above, or an alternative value of the suggested scaling factor σ computed as the absolute maximal input value $x_{mx}$ times a variable (ρ) divided by the quantization bin width of the DAC ($r_{DAC}$), i.e., $$\sigma \leftarrow \frac{x_{mx} \rho}{r_{DAC}},$$

whichever is smaller:

$$\sigma \leftarrow \min\left(\frac{x_{mx} \rho}{r_{DAC}}, \frac{\omega s}{b}\right). \tag{8}$$

In the case of an input range (−1, . . . , 1), the total range is 2. This total range is divided by the DAC into n steps, where n is the number of quantization steps (e.g., n=256 in the case of an 8-bit DAC), to arrive at the quantization bin width (or simply 'bin width'). Thus, in the present example, the quantization bin width $$\frac{2}{n} \text{ is } \frac{2}{256} = r_{DAC}.$$

According to an exemplary embodiment, variable ρ=0.25. Variable ρ is essentially 1 over the minimal effective bit resolution. Thus, for a value of ρ=0.25 one would allow only 4 different values in the input range (instead of 256) because of the scaling of σ.

In step 222, the noise and bound management scaling factor (α) is set to $x_{mx}$ (from Equation 3 above) or the value of the suggested scaling factor σ (from Equation 8 above), whichever is larger, i.e., $$\alpha = \max(x_{mx}, \sigma). \tag{9}$$

Doing so avoids making the maximal value of the scaled input vector values (see step 224—described below) larger than 1 (which is assumed to be the maximal input vector value range of the DAC set arbitrarily to (−1, . . . , 1)), as one does not want the input values to be clipped.

As highlighted above, the above-described process is employed to pre-compute the noise and bound management scaling factor α for each multiply-and-accumulate cycle performed on the analog crossbar array 104 of RPU devices 110. Thus, in step 224, each of the digital input vector values x is scaled by the noise and bound management scaling factor (α) (computed in step 222), i.e., $$x \leftarrow x/\alpha, \tag{10}$$

to provide scaled digital input vector values x' that are converted to an analog signal via the digital-to-analog converter (DAC). In step 226, the analog computation is then performed on the analog crossbar array 104 of RPU devices 110. As highlighted above, the analog computation involves performing a vector-matrix multiplication operation on the analog crossbar array 104 of RPU devices 110 by multiplying each of the scaled input vector values x' with a corresponding weight value in the weight matrix 102.

Likewise, in step 228 each of the analog output vector values obtained from the analog crossbar array 104 of RPU devices 110 is converted to a digital signal via the analog-to-digital converter (ADC) to provide digital output vector values y'. In step 230, each of the digital output vector values y' is re-scaled by the noise and bound management scaling factor (α) (computed in step 222), i.e., $$y \leftarrow y'\alpha, \tag{11}$$

to provide re-scaled digital output vector values y.

Figure 3:
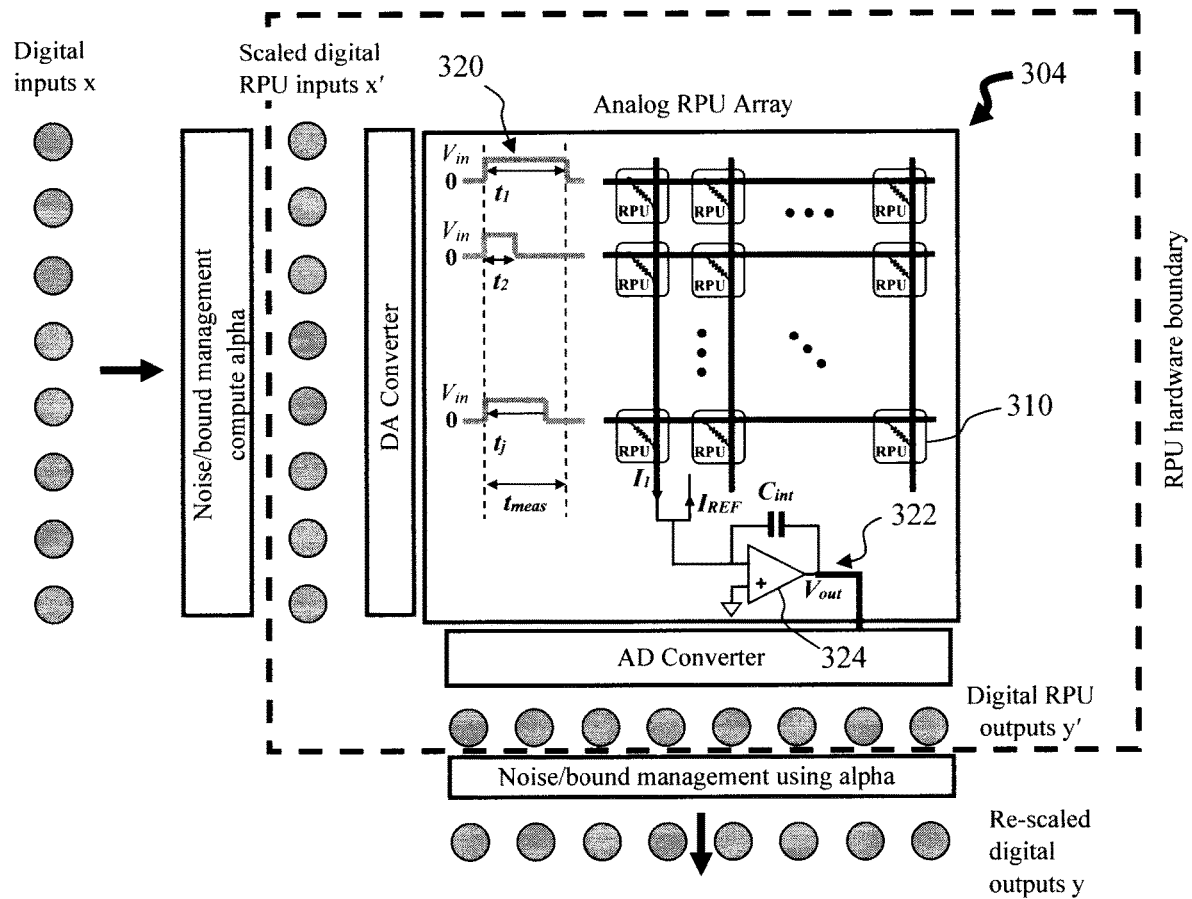
FIG. 3 is a diagram illustrating an exemplary implementation of the present noise and bound management techniques in a forward cycle operation according to an embodiment of the present invention.
Figure 4:
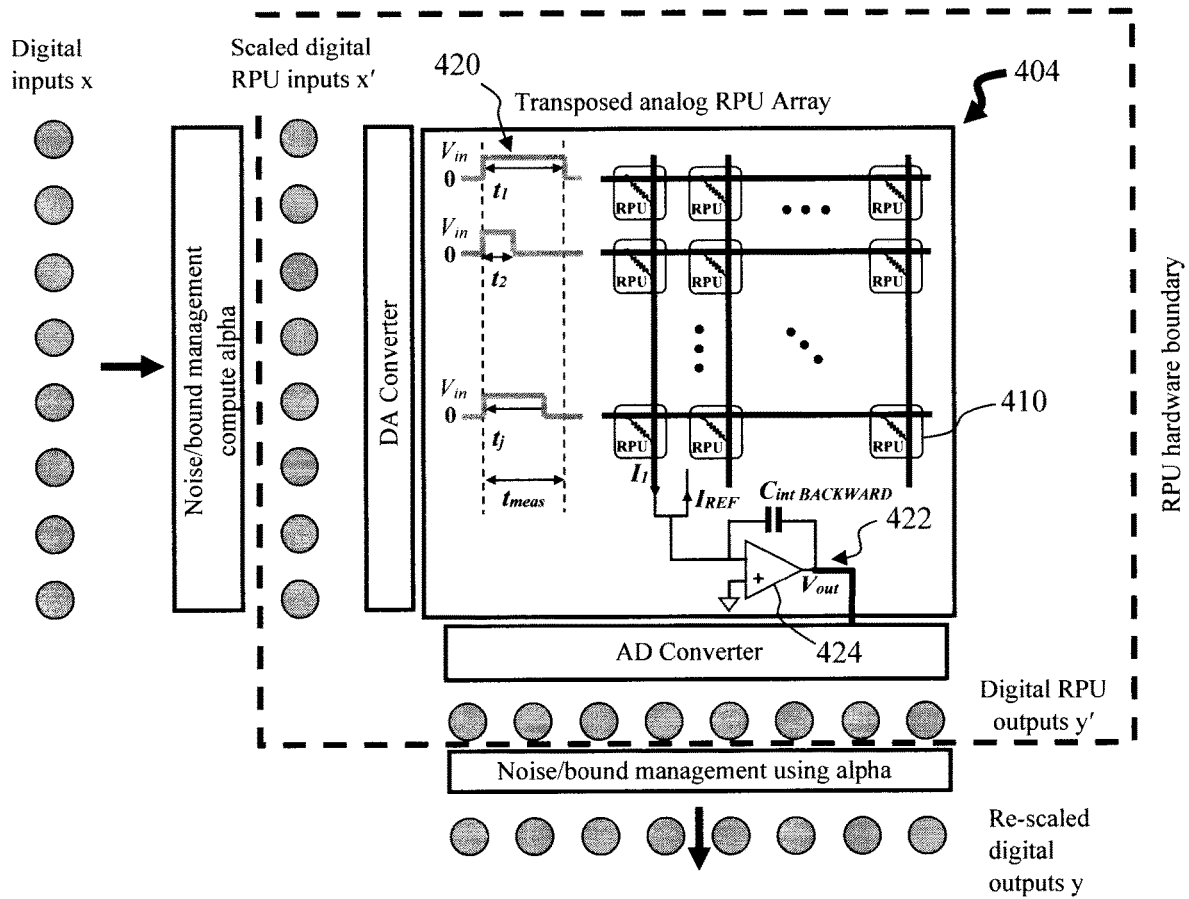
FIG. 4 is a diagram illustrating an exemplary implementation of the present noise and bound management techniques in a backward cycle operation according to an embodiment of the present invention.

An exemplary implementation of the present techniques is now described by way of reference to FIG. 3 and FIG. 4. Namely, FIG. 3 is a schematic diagram illustrating a forward cycle operation being performed on an analog crossbar array 304 of RPU devices 310. As shown in FIG. 3, digital input vector values x (see "Digital inputs x") are provided as input to the analog crossbar array 304 of RPU devices 310. First however, the noise and bound management scaling factor (α) is computed as described in conjunction with the description of methodology 200 of FIG. 2 above (see "Noise/bound management compute alpha"). Each of the digital input vector values x is then scaled by the noise and bound management scaling factor (α), i.e., x←x/α, to provide scaled digital input vector values x' (see "Scaled digital RPU inputs x'").

The scaled digital input vector values x' are converted to an analog signal via a digital-to-analog converter (see "DA Converter"). The analog signal is provided as analog pulse widths 320 to the analog crossbar array 304 of RPU devices 310 where analog computation is performed on the analog crossbar array 304 of RPU devices 310. As highlighted above, this analog computation involves performing a vector-matrix multiplication operation on the analog crossbar array 304 of RPU devices 310 by multiplying each of the scaled input vector values x' with a corresponding weight value in a corresponding weight matrix (not shown). The mapping of a weight matrix to an analog crossbar array of RPU devices was described in conjunction with the description of FIG. 1 above.

As shown in FIG. 3, the analog output vector values obtained from the operations performed on the analog crossbar array 304 of RPU devices 310 are provided to an integrated circuit 322 including an operational amplifier 324 with a capacitor ($C_{int}$) connected to (across) the inverting input of the operational amplifier 324 and the output ($V_{out}$) of the operational amplifier 324. The non-inverting input of the operational amplifier 324 is connected to ground. The output ($V_{out}$) of the operational amplifier 324 is also connected to an input of an analog-to-digital converter (see "AD Converter").

The analog-to-digital converter (AD Converter) converts each of the analog output vector values obtained from the analog crossbar array 304 of RPU devices 310 to a digital signal to provide digital output vector values y' (see "Digital RPU outputs y'"). Each of the digital output vector values y' is then re-scaled by the noise and bound management scaling factor (α) (see "Noise/bound management using alpha"), i.e., y←yα, to provide re-scaled digital output vector values y (see "Re-scaled digital outputs y"). As provided above, the processes such as calculation of the noise and bound management scaling factor α, scaling/rescaling the input/output values from the crossbar array of RPU devices by α, etc. can be performed outside of the of the RPU array hardware, for example, by an apparatus such as apparatus 600 described in conjunction with the description of FIG. 6, below.

FIG. 4 is a schematic diagram illustrating a backward cycle operation being performed on an analog crossbar array 404 of RPU devices 410. The process is generally the same as the forward cycle operation described in conjunction with the description of FIG. 3 above, except that a transposed analog RPU array 404 is employed for the backward cycle pass. By 'transposed' it is meant that the inputs and outputs are exchanged, i.e., the former output now becomes the input and the former input becomes the output. This is to (essentially) compute x=W'y where W' is the transpose of matrix W. As shown in FIG. 4, digital input vector values x (see "Digital inputs x") are provided as input to the analog crossbar array 404 of RPU devices 410. First however, the noise and bound management scaling factor (α) is computed as described in conjunction with the description of methodology 200 of FIG. 2 above (see "Noise/bound management compute alpha"). Namely, as provided above, for each forward and backward cycle, the steps of methodology 200 are performed as a pre-computation in digital to determine the scaling factor σ used for operations on the analog crossbar array of RPU devices. Each of the digital input vector values x is then scaled by the noise and bound management scaling factor (α), i.e., x←x/α, to provide scaled digital input vector values x' (see "Scaled digital RPU inputs x'").

The scaled digital input vector values x' are then converted to an analog signal via a digital-to-analog converter (see "DA Converter"). The analog signal is provided as analog pulse widths 420 to the analog crossbar array 404 of RPU devices 410 where analog computation is performed on the analog crossbar array 404 of RPU devices 410. As highlighted above, this analog computation involves performing a vector-matrix multiplication operation on the analog crossbar array 404 of RPU devices 410 by multiplying each of the scaled input vector values x' with a corresponding weight value in a corresponding weight matrix (not shown). The mapping of a weight matrix to an analog crossbar array of RPU devices was described in conjunction with the description of FIG. 1 above.

As shown in FIG. 4, the analog output vector values obtained from the operations performed on the analog crossbar array 404 of RPU devices 410 are provided to an integrated circuit 422 including an operational amplifier 424 with a capacitor ($C_{int\ BACKWARD}$) connected to (across) the inverting input of the operational amplifier 424 and the output ($V_{out}$) of the operational amplifier 424. The non-inverting input of the operational amplifier 424 is connected to ground. The output ($V_{out}$) of the operational amplifier 424 is also connected to an input of an analog-to-digital converter (see "AD Converter").

The analog-to-digital converter (AD Converter) converts each of the analog output vector values obtained from the analog crossbar array 404 of RPU devices 410 to a digital signal to provide digital output vector values y' (see "Digital RPU outputs y'"). Each of the digital output vector values y' is then re-scaled by the noise and bound management scaling factor (α) (see "Noise/bound management using alpha"), i.e., y←yα, to provide re-scaled digital output vector values y (see "Re-scaled digital outputs y"). As provided above, the processes such as calculation of the noise and bound management scaling factor α, scaling/rescaling the input/output values from the crossbar array of RPU devices by α, etc. can be performed outside of the of the RPU array hardware, for example, by an apparatus such as apparatus 600 described in conjunction with the description of FIG. 6, below.

As provided above, the present techniques minimize run time by scaling the input vector values x to an analog crossbar array of RPU devices based on a worst-case scenario. With the embodiments described above, taking the worst-case situation as a reference for determining the scaling factor ensures that the output bound is never clipped.

Figure 5:
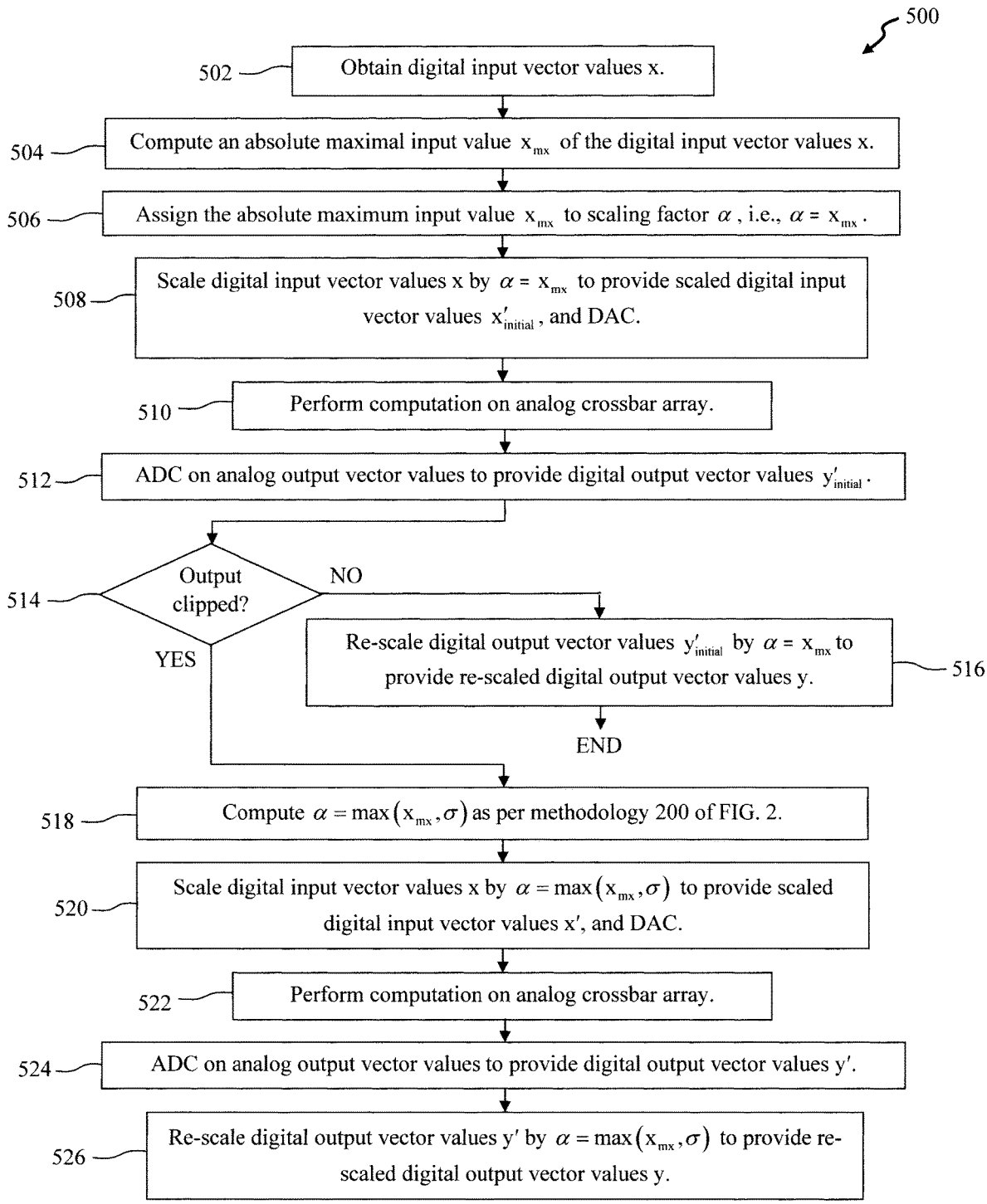
FIG. 5 is a diagram illustrating an alternative exemplary methodology for noise and bound management according to an embodiment of the present invention.

According to an alternative embodiment, the above-described methodology 200 is performed (i.e., to calculate the worst-case noise and bound management scaling factor α, scale/rescale the input/output values from the crossbar array of RPU devices by α, etc.) only if and when the bound is exceeded. See, for example, exemplary methodology 500 of FIG. 5.

In step 502, an input vector of digital values x, i.e., 'input vector values x' is obtained. According to an exemplary embodiment, the input vector values x include data from a training dataset. By way of example only, the training dataset can be obtained from a database or other repository of DNN training data.

In step 504, an absolute maximal value $x_{mx}$ of the input vector values (also referred to herein as the absolute maximal input value) is computed according to Equation 3, above. In step 506, the absolute maximal input value $x_{mx}$ is assigned to noise and bound management scaling factor α, i.e., compute $α=x_{mx}$.

In step 508, each of the digital input vector values x is scaled by the noise and bound management scaling factor $α=x_{mx}$, i.e., $$x_{initial}' \leftarrow x/α, \quad (12)$$

to provide scaled digital input vector values $x_{initial}'$ that are converted to an analog signal via the digital-to-analog converter (DAC). In step 510, the analog computation is then performed on the analog crossbar array 104 of RPU devices 110. As highlighted above, the analog computation involves performing a vector-matrix multiplication operation on the analog crossbar array 104 of RPU devices 110 by multiplying each of the scaled input vector values $x_{initial}'$ with a corresponding weight value in the weight matrix 102. Likewise, in step 512 each of the analog output vector values obtained from the analog crossbar array 104 of RPU devices 110 is converted to a digital signal via the analog-to-digital converter (ADC) to provide digital output vector values $y_{initial}'$.

In step 514, a determination is made as to whether any of the digital output vector values $y_{initial}'$ has been clipped (bound management). For instance, determining whether any of the digital output vector values $y_{initial}'$ has been clipped can be performed by sensing saturation at the output of the operational amplifier. There are circuit methods for determining the clipping of the bound. However, a straight-forward way is to simply use the maximal and minimal output values of the ADC, as the output will be saturated to these values when the inputs to the ADC exceed the ADC range. Thus, for instance, if any digital output is 255 (which is the highest output value for an 8 bit DAC) or 0 (which is the lowest output value for an 8 bit DAC), then it is determined that the bound was clipped and the computation is repeated.

If it is determined in step 514 that NO none of the digital output vector values $y_{initial}'$ has been clipped, then in step 516, each of the digital output vector values $y_{initial}'$ is re-scaled by the noise and bound management scaling factor $α=x_{mx}$, i.e., $$y \leftarrow y_{initial}'α, \quad (13)$$

to provide re-scaled digital output vector values y, and the process is ended. On the other hand, if it is determined in step 514 that YES at least one of the digital output vector values $y_{initial}'$ has been clipped, then in step 518 the worst-case scenario noise and bound management scaling factor α is computed as $α=\max(x_{mx},σ)$ (see Equation 8, above) as is described in conjunction with the description of methodology 200 of FIG. 2 above.

In step 520, each of the digital input vector values x is then scaled by the worst-case scenario noise and bound management scaling factor $α=\max(x_{mx},σ)$, i.e., $$x' \leftarrow x/α, \quad (14)$$

to provide scaled digital input vector values x' that are converted to an analog signal via the DAC. In step 522, the analog computation is then performed on the analog crossbar array 104 of RPU devices 110. As highlighted above, the analog computation involves performing a vector-matrix multiplication operation on the analog crossbar array 104 of RPU devices 110 by multiplying each of the scaled input vector values x' with a corresponding weight value in the weight matrix 102.

Likewise, in step 524 each of the analog output vector values obtained from the analog crossbar array 104 of RPU devices 110 is converted to a digital signal via the ADC to provide digital output vector values y'. In step 526, each of the digital output vector values y' is re-scaled by the worst-case scenario noise and bound management scaling factor $α=\max(x_{mx},σ)$, i.e., $$y \leftarrow y'α, \quad (15)$$

to provide re-scaled digital output vector values y. In this second iteration, the output bound clipping is not tested since the bound is typically not clipped in the usual worst case scenario. However, even if the assumed maximal weight ω is changed (see above), and some clipping occurs, this clipping should be ignored and the bounds not tested in the second iteration. Thus, at worst, methodology 500 requires only two iterations, i.e., one initially where it is determined that the output bound has been clipped, and then again with the worst-case scenario noise and bound management scaling factor α. As such, impacts to run time are minimal, i.e., the run time is increased at most twice.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
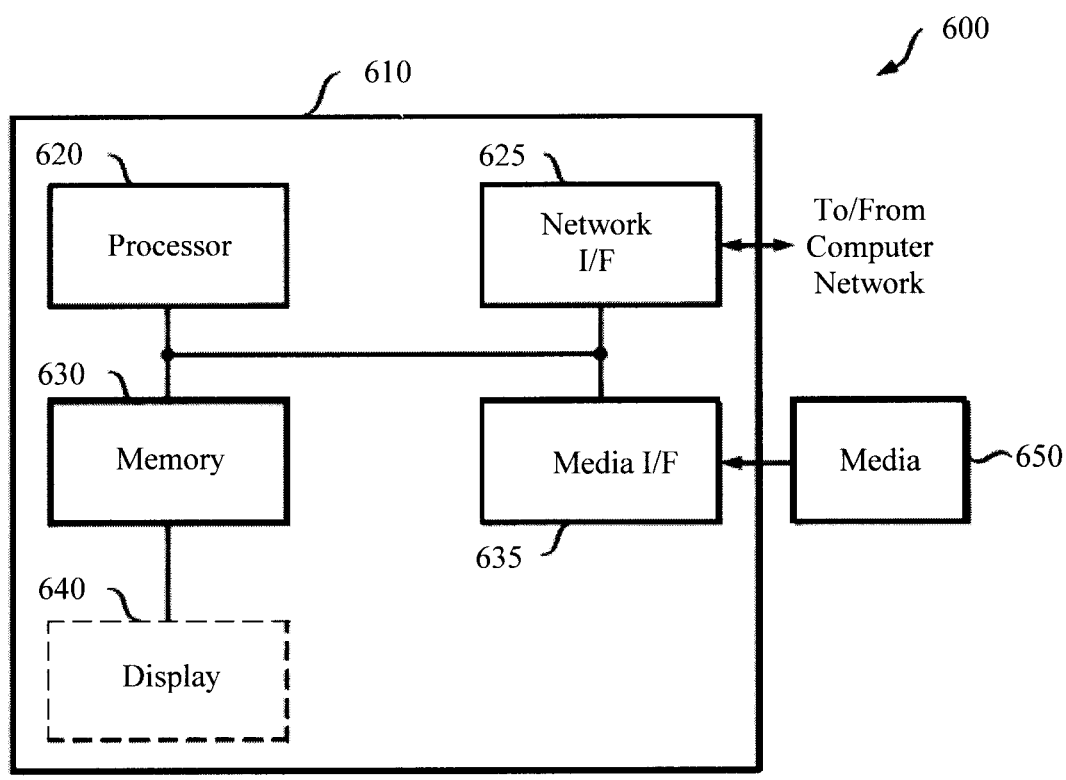
FIG. 6 is a diagram illustrating an exemplary apparatus for performing one or more of the methodologies presented herein according to an embodiment of the present invention.

As provided above, according to an exemplary embodiment, one or more steps of methodology 200 including calculation of the noise and bound management scaling factor $\alpha$, scaling/rescaling the input/output values from the crossbar array of RPU devices, etc. can be performed outside of the of the RPU array hardware, for example, by an apparatus such as apparatus 600 shown in FIG. 6. FIG. 6 is a block diagram of an apparatus 600 for implementing one or more of the methodologies presented herein. By way of example only, apparatus 600 can be configured to implement one or more of the steps of methodology 200 of FIG. 2.

Apparatus 600 includes a computer system 610 and removable media 650. Computer system 610 includes a processor device 620, a network interface 625, a memory 630, a media interface 635 and an optional display 640. Network interface 625 allows computer system 610 to connect to a network, while media interface 635 allows computer system 610 to interact with media, such as a hard drive or removable media 650.

Processor device 620 can be configured to implement the methods, steps, and functions disclosed herein. The memory 630 could be distributed or local and the processor device 620 could be distributed or singular. The memory 630 could be implemented as an electrical, magnetic or optical memory, or any combination of these or other types of storage devices. Moreover, the term "memory" should be construed broadly enough to encompass any information able to be read from, or written to, an address in the addressable space accessed by processor device 620. With this definition, information on a network, accessible through network interface 625, is still within memory 630 because the processor device 620 can retrieve the information from the network. It should be noted that each distributed processor that makes up processor device 620 generally contains its own addressable memory space. It should also be noted that some or all of computer system 610 can be incorporated into an application-specific or general-use integrated circuit.

Optional display 640 is any type of display suitable for interacting with a human user of apparatus 600. Generally, display 640 is a computer monitor or other similar display.

Figure 7:
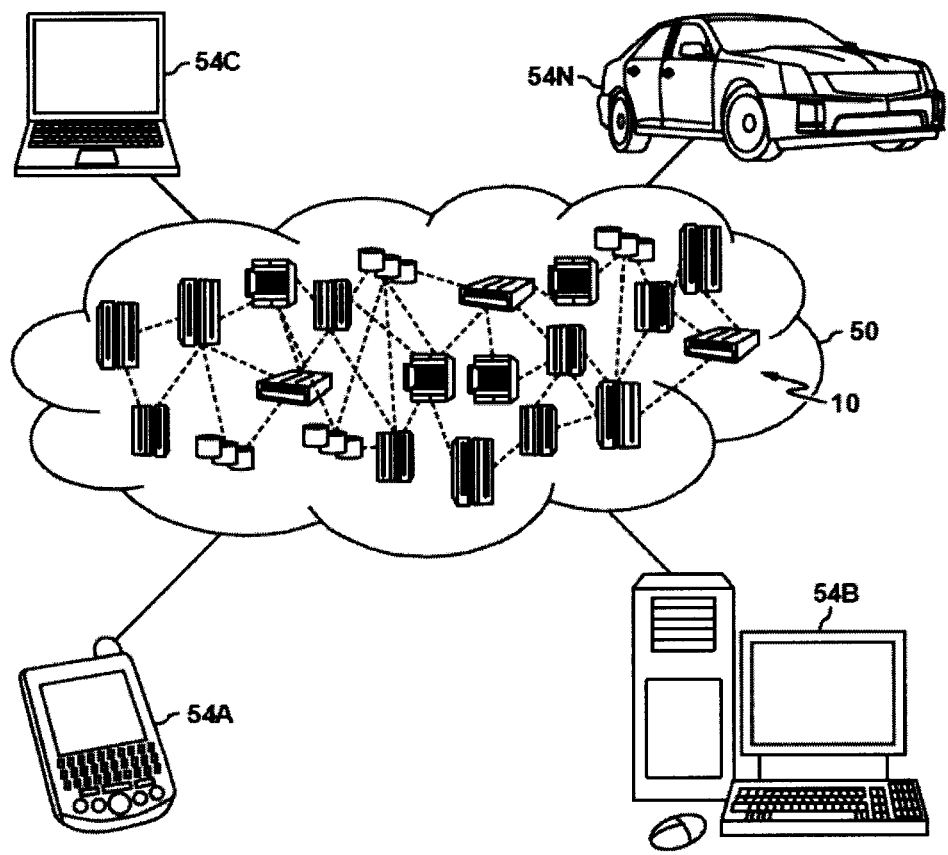
FIG. 7 depicts a cloud computing environment according to an embodiment of the present invention.
Figure 8:
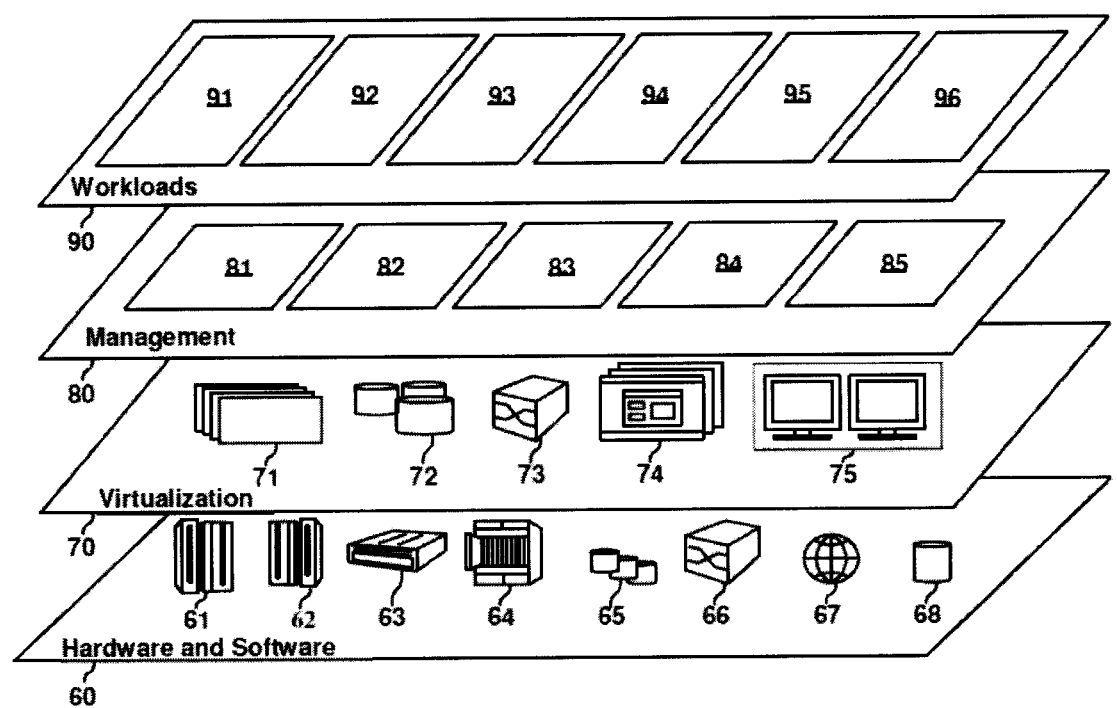
FIG. 8 depicts abstraction model layers according to an embodiment of the present invention.

Referring to FIG. 7 and FIG. 8, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 7, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Referring now to FIG. 8, a set of functional abstraction layers provided by cloud computing environment 50 (FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and scaling factor calculation and input/output scaling/rescaling 96.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for noise and bound management, the method comprising:
   obtaining input vector values x for an analog crossbar array of resistive processing unit (RPU) devices, wherein a weight matrix is mapped to the analog crossbar array of RPU devices; and
   scaling the input vector values x based on a worst-case scenario to provide scaled input vector values x' to use as input to the analog crossbar array of RPU devices, wherein the worst-case scenario comprises an assumed maximal weight of the weight matrix multiplied by a sum of absolute values from the input vector values x;
   converting the scaled input vector values x' to an analog signal; and
   performing a vector-matrix multiplication operation on the analog crossbar array of RPU devices.

2. The method of claim 1, further comprising:
   computing an absolute maximal input value $x_{mx}$ from the input vector values x;
   computing a suggested scaling factor σ as $$\frac{\omega s}{b},$$

wherein ω is the assumed maximal weight of the weight matrix, s is a total input variable, and b is an output bound of the analog crossbar array of RPU devices;
   setting a noise and bound management scaling factor α to the absolute maximal input value $x_{mx}$ or the suggested scaling factor σ, whichever is larger; and
   scaling the input vector values x using the noise and bound management scaling factor α.

3. The method of claim 2, wherein the absolute maximal input value $x_{mx}$ is computed as $x_{mx} = \max_i |x_i|$.

4. The method of claim 2, further comprising:
   calculating a sum of all absolute values of the input vector values x; and
   assigning the sum of all of the absolute values of the input vector values x to the total input variable s.

5. The method of claim 2, further comprising:
   calculating a sum of all absolute values of only positive input vector values ($s_p$);
   calculating a sum of all absolute values of only negative input vector values ($s_n$); and
   assigning a larger of $s_p$ and $s_n$ to the total input variable s.

6. The method of claim 2, further comprising:
   capping the suggested scaling factor σ as either a value computed as $$\frac{\omega s}{b}$$

or an alternative value computed as $$\frac{x_{mx} \rho}{r_{DAC}},$$

whichever is smaller, wherein ρ is a variable, and $r_{DAC}$ is a bin width of digital-to-analog quantization.

7. The method of claim 2, further comprising:
   reducing the assumed maximal weight ω of the weight matrix; and
   recomputing the suggested scaling factor σ.

8. The method of claim 1, wherein performing the vector-matrix multiplication operation comprises:
   multiplying each of the scaled input vector values x' with a corresponding weight value in the weight matrix.

9. The method of claim 2, further comprising:
   converting analog output vector values obtained from the analog crossbar array of RPU devices to a digital signal to provide digital output vector values y'; and
   re-scaling the digital output vector values y' using the noise and bound management scaling factor α to provide re-scaled digital output vector values y.

10. The method of claim 1, further comprising:
    computing an absolute maximal input value $x_{mx}$ from the input vector values x;

assigning the absolute maximal input value $x_{mx}$ to a scaling factor α;

scaling the input vector values x using the scaling factor α to provide scaled input vector values $x'_{initial}$ to use as input to the analog crossbar array of RPU devices;

converting the scaled input vector values $x'_{initial}$ to the analog signal;

performing the vector-matrix multiplication operation on the analog crossbar array of RPU devices;

converting analog output vector values obtained from the analog crossbar array of RPU devices to a digital signal to provide digital output vector values $y'_{initial}$;

determining whether any of the digital output vector values $y'_{initial}$ has been clipped; and scaling the input vector values x based on the worst-case scenario when at least one of the digital output vector values $y'_{initial}$ has been clipped.

11. An apparatus for noise and bound management comprising a processor, connected to a memory, operable to:

obtain input vector values x for an analog crossbar array of resistive processing unit (RPU) devices, wherein a weight matrix is mapped to the analog crossbar array of RPU devices; and scale the input vector values x based on a worst-case scenario to provide scaled input vector values x' to use as input to the analog crossbar array of RPU devices, wherein the worst-case scenario comprises an assumed maximal weight of the weight matrix multiplied by a sum of absolute values from the input vector values x;

convert the scaled input vector values x' to an analog signal; and perform a vector-matrix multiplication operation on the analog crossbar array of RPU devices.

12. The apparatus of claim 11, wherein the processor is further operable to:

compute an absolute maximal input value $x_{mx}$ from the input vector values x;

compute a suggested scaling factor σ as $$\frac{\omega s}{b},$$

wherein ω is the assumed maximal weight of the weight matrix, s is a total input variable, and b is an output bound of the analog crossbar array of RPU devices;

set a noise and bound management scaling factor α to the absolute maximal input value $x_{mx}$ or the suggested scaling factor σ, whichever is larger; and scale the input vector values x using the noise and bound management scaling factor α.

13. The apparatus of claim 12, wherein the processor is further operable to:

calculate a sum of all absolute values of the input vector values x; and assign the sum of all of the absolute values of the input vector values x to the total input variable s.

14. The apparatus of claim 12, wherein the processor is further operable to:

calculate a sum of all absolute values of only positive input vector values ($s_p$);

calculate a sum of all absolute values of only negative input vector values ($s_n$); and assign a larger of $s_p$ and $s_n$ to the total input variable s.

15. The apparatus of claim 12, wherein the processor is further operable to:

cap the suggested scaling factor σ as either a value computed as $$\frac{\omega s}{b}$$

or an alternative value computed as $$\frac{x_{mx}\rho}{r_{DAC}},$$

whichever is smaller, wherein ρ is a variable, and $r_{DAC}$ is a bin width of digital-to-analog quantization.

16. A non-transitory computer program product for noise and bound management, the computer program product comprising a computer readable storage medium having program instructions embodied therewith, the program instructions executable by a computer to cause the computer to:

obtain input vector values x for an analog crossbar array of resistive processing unit (RPU) devices, wherein a weight matrix is mapped to the analog crossbar array of RPU devices; and scale the input vector values x based on a worst-case scenario to provide scaled input vector values x' to use as input to the analog crossbar array of RPU devices, wherein the worst-case scenario comprises an assumed maximal weight of the weight matrix multiplied by a sum of absolute values from the input vector values x;

convert the scaled input vector values x' to an analog signal; and perform a vector-matrix multiplication operation on the analog crossbar array of RPU devices.

17. The non-transitory computer program product of claim 16, wherein the program instructions further cause the computer to:

compute an absolute maximal input value $x_{mx}$ from the input vector values x;

compute a suggested scaling factor σ as $$\frac{\omega s}{b},$$

wherein ω is the assumed maximal weight of the weight matrix, s is a total input variable, and b is an output bound of the analog crossbar array of RPU devices;

set a noise and bound management scaling factor α to the absolute maximal input value $x_{mx}$ or the suggested scaling factor σ, whichever is larger; and scale the input vector values x using the noise and bound management scaling factor α.

18. The non-transitory computer program product of claim 17, wherein the program instructions further cause the computer to:

calculate a sum of all absolute values of the input vector values x; and assign the sum of all of the absolute values of the input vector values x to the total input variable s.

19. The non-transitory computer program product of claim 17, wherein the program instructions further cause the computer to:
 calculate a sum of all absolute values of only positive input vector values ($s_p$);
 calculate a sum of all absolute values of only negative input vector values ($s_n$); and
 assign a larger of $s_p$ and $s_n$ to the total input variable s.

* * * * *